US012765354B1

(12) United States Patent
Ilangovan et al.

(10) Patent No.: US 12,765,354 B1
(45) Date of Patent: Oct. 13, 2026

(54) HIGH FREQUENCY INTERCONNECT WITH REDUCED MUTUAL INTERFERENCE

(71) Applicant: AWAVE SEMICONDUCTOR INDIA PRIVATE LIMITED, Bengaluru (IN)

(72) Inventors: Ilamparidhi Ilangovan, Bengaluru (IN); Musappagari Gangaraju, Bengaluru (IN); Diksha Acharya, Bengaluru (IN)

(73) Assignee: Awave Semiconductor India Pvt. Ltd., Bangalore (IN)

( * ) Notice: Subject to any disclaimer, the term of this patent is extended or adjusted under 35 U.S.C. 154(b) by 380 days.

(21) Appl. No.: 18/586,244

(22) Filed: Feb. 23, 2024

(51) Int. Cl.
*H10W 20/41* (2026.01)
*H10W 72/20* (2026.01)
*H10W 72/29* (2026.01)
*H10W 72/90* (2026.01)

(52) U.S. Cl.
CPC ........ *H10W 20/423* (2026.01); *H10W 72/221* (2026.01); *H10W 72/29* (2026.01); *H10W 72/952* (2026.01)

(58) Field of Classification Search
CPC ............. H10W 20/031; H10W 20/423; H10W 20/427; H10W 20/43; H10W 70/099; H10W 70/62; H10W 70/63; H10W 70/635; H10W 70/641; H10W 70/644; H10W 70/65; H10W 70/652; H10W 70/6523; H10W 70/6525; H10W 70/6528; H10W 70/654; H10W 70/655; H10W 70/656; H10W 70/6565; H10W 70/657; H10W 70/658; H10W 72/221; H10W 72/222; H10W 72/223; H10W 72/225; H10W 72/227; H10W 72/228; H10W 72/29; H10W 72/952
See application file for complete search history.

(56) References Cited

U.S. PATENT DOCUMENTS

2016/0148866 A1* 5/2016 Yong ...................... H05K 1/025 438/618

* cited by examiner

*Primary Examiner* — Cheung Lee
(74) *Attorney, Agent, or Firm* — Gerald P. Joyce, III

(57) ABSTRACT

An interconnect that includes different types of cross talk reduction elements that includes metal cages and conductive cage coupling elements that electrically couple the metal cages and are configured to reduce cross talk between high frequency signals.

19 Claims, 7 Drawing Sheets

201

202

205

206

HIGH FREQUENCY INTERCONNECT WITH REDUCED MUTUAL INTERFERENCE

Chip-on-Wafer-on-Substrate (CoWoS) is an example of an interposer-based packaging technology. Multiple dies (some of which are located side by side) are bonded through micro-bumps on one side of a silicon interposer forming a chip-on-wafer (CoW). Another side of the CoW is bonded through bumps to a package substrate to form the CoWoS.

The interposer includes an interconnect that includes multiple signal conductors configured to convey multiple high-frequency signals that are subjected to mutual interference.

There is a growing need to effectively reduce mutual interference.

SUMMARY

There is provided a high frequency interconnect and for a method for reducing mutual interference.

BRIEF DESCRIPTION

The subject matter regarding the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Any reference to cross talk should be applied mutatis mutandis to interference.

Any reference to interference should be applied mutatis mutandis to cross talk.

There is provided an interconnect for high frequency signals.

According to an embodiment, the interconnect reduces cross talk in a highly effective manner while maintaining a small distance between different signal conductors of the interconnect.

According to an embodiment, the interconnect is configured to reduce cross talk using different types of cross talk reduction elements—including metal cages and conductive cage coupling elements—thereby reducing the footprint and cost of the crosstalk reduction.

According to an embodiment, the conductive cage coupling elements reduce cross talk and also electrically couple metal cages.

According to an embodiment, different cross talk reduction elements are included in grounded paths that are formed (at least in part) within the interconnect.

According to an embodiment, the staggered arrangement of the different types of crosstalk reduction elements allows having signal conductors in each metal layer-without having metal layers that are used only for shielding signals.

Figure 1:
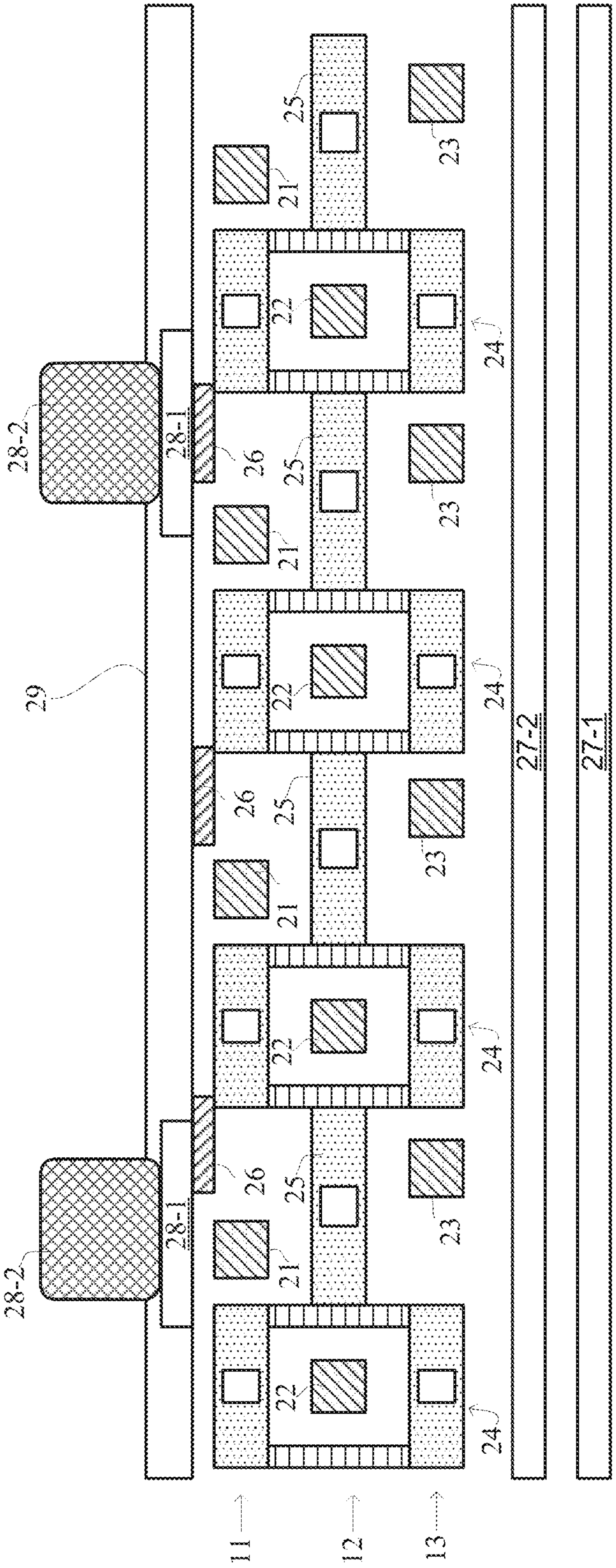
FIG. 1 illustrates an example of a portion of an interconnect.

FIG. 1 illustrates an example of a cross section of a portion of an interconnect 10.

According to an embodiment, the portion of the interconnect 10 includes:

a. First signal conductors (each first signal conductor is denoted 21) that are formed in a first metal layer 11 and are configured to convey first signals. The first signals are high-frequency signals having a frequency that is at least one Gigahertz.

b. Second signal conductors (each second signal conductor is denoted 22) that are formed in a second metal layer 12 and are configured to convey second signals. The second signals are high-frequency signals having a frequency that is at least one Gigahertz.

c. Third signal conductors (each third signal conductor is denoted 23) that are formed in a third metal layer 13 and are configured to convey third signals. The third signals are The high-frequency signals having a frequency that is at least one Gigahertz.

d. Metal cages (each metal cage denoted 24) that surround the second signal conductors and are configured to reduce cross talk related to the second signals. According to an embodiment there is a metal cage per second signal conductor.

e. Conductive cage coupling elements (each conductive cage coupling element is denoted 25) that electrically couple the metal cages. The conductive cage coupling elements are configured to reduce cross talk between the first signals and the third signals.

f. Additional cross talk reduction elements (each additional cross talk reduction element is denoted 26) that are configured to ground the metal cages and/or the conductive cage coupling elements. According to an embodiment, at least one additional cross talk reduction element is electrically coupled to a micro-bump of an interposer.

According to an embodiment, each metal cage is configured to isolate one of the second signal conductors and is configured to shield a second signal (conveyed by the second conductor) from cross talk.

According to an embodiment, at least one additional cross talk reduction element (such as via 26) is electrically coupled to a micro-bump 28-2 through under bump metallurgy (UBM) 28-1 of an Aluminium Pad Metal layer (AP). When the micro-bump is grounded—the electric coupling between the micro-bump, and other cross talk reduction elements (such as metal cages and conductive cage coupling elements) forms grounded paths that reduce cross talk between the first and/or second and/or third signals.

According to an embodiment, the interconnect portion also includes additional metal layers located below the first metal layer—for example, first auxiliary layer 27-1 and a second auxiliary layer 27-2.

According to an embodiment, each metal cage is configured to shield a second signal conductor.

According to an embodiment, a conductive cage coupling element includes a metal grid.

According to an embodiment, the conductive cage coupling elements are formed in the second metal layer 12.

Figure 2:
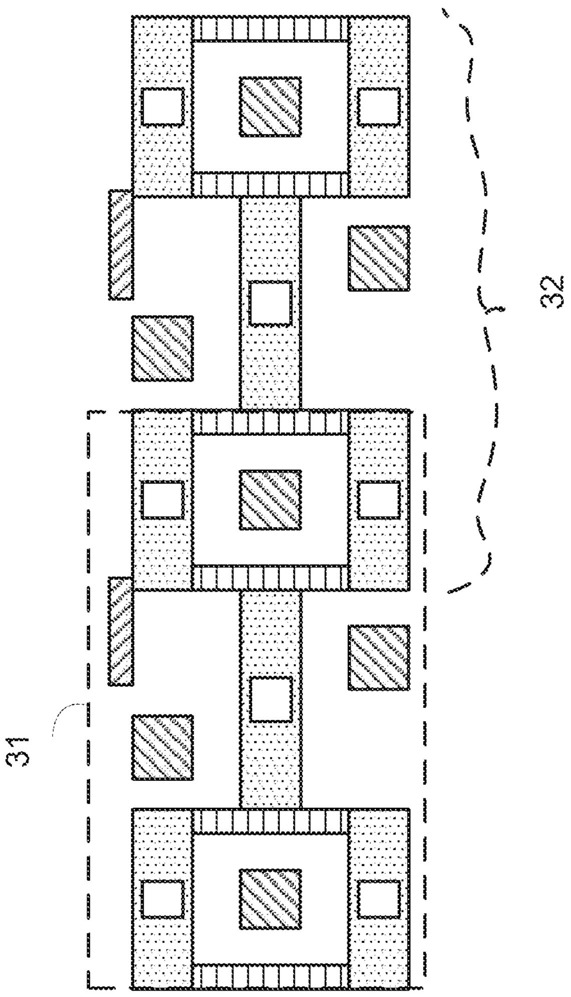
FIG. 2 illustrates an example of a portion of an interconnect.

According to an embodiment, the interconnect includes interconnect regions (see, for example interconnect region 31 and interconnect region 32 of FIG. 2).

An interconnect region includes a corresponding conductive cage coupling element, a corresponding first signal conductor, a corresponding second signal conductor, a corresponding first metal case and a corresponding second metal cage.

It should be noted that the first metal cage of one interconnect region may be a second metal cage of a second interconnect region- and vice versa.

According to an embodiment, within an interconnect region, a corresponding first signal conductor is (i) closer, in relation to the corresponding second signal conductor, to the corresponding first metal cage, and (ii) more distance, in relation to the corresponding second signal conductor, to the corresponding second metal cage.

According to an embodiment, within the interconnect portion, the first metal layer, the second metal layer, and the third metal layer are parallel to each other. According to an embodiment, outside the interconnect portion the first metal layer, the second metal layer, and the third metal layer are not parallel to each other and/or are not planar—for example when reaching to an upper surface of the interconnect.

According to an embodiment, a distance between adjacent metal cages is below ten microns, and a distance between a metal cage and adjacent signal conductors is below ten microns.

Figure 3:
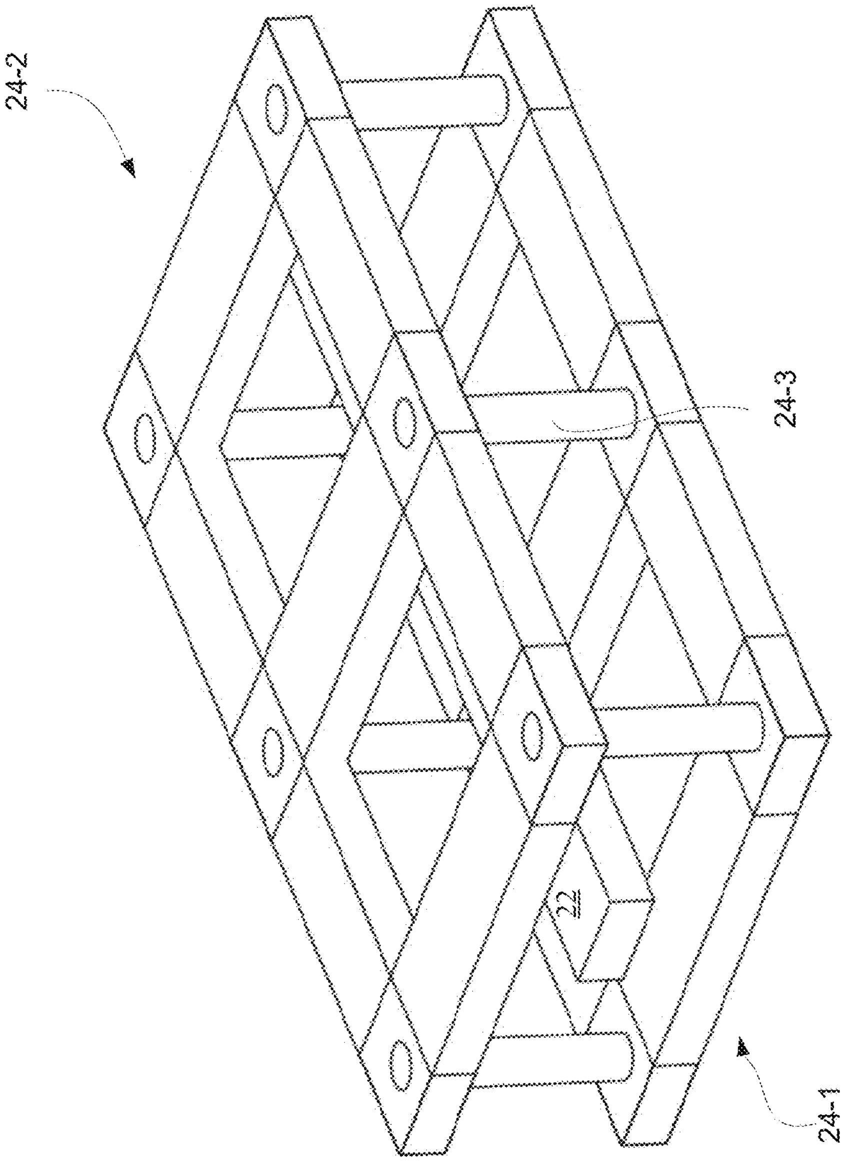
FIG. 3 illustrates an example of a metal cage.

FIG. 3 illustrates an example of metal cage 24, and a second signal conductor 22 that is surrounded by the metal cage 24.

According to an embodiment, metal cage 24 includes:

a. A proximal conductive grid 24-1 that is formed in the first metal layer.

b. A distal conductive grid 24-2 that is formed in the third metal layer.

c. A set of inter-layer vias 24-3 that connect the proximal conductive grid to the distal conductive grid.

While FIG. 3 illustrates two rows of inter-layer vias, there may be any number of inter-layer vias per metal cage.

The terms "proximal" and "distal" are used in relation to a surface (for example upper surface) of the interconnect that interfaces with the micro-bumps.

Figure 4:
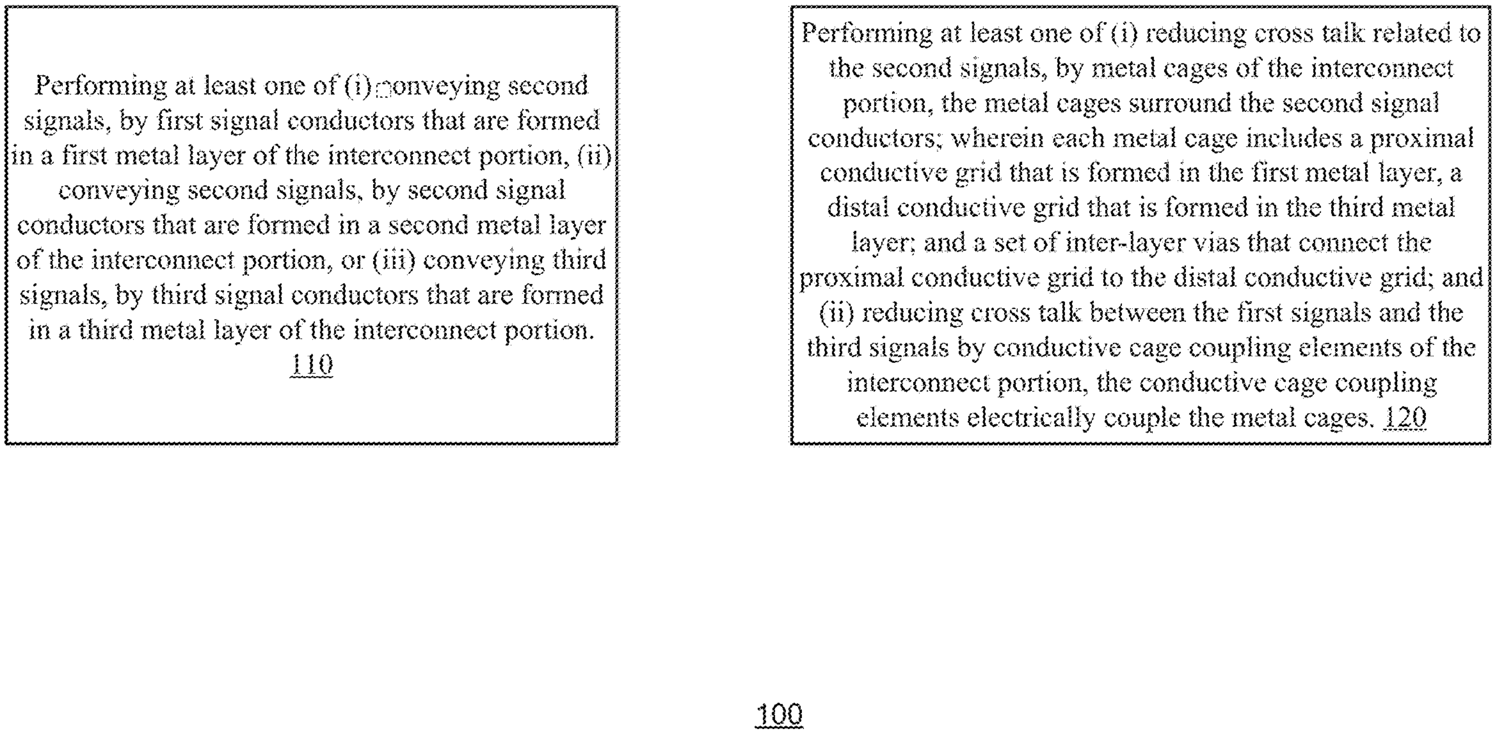
FIG. 4 illustrates an example of a method.

FIG. 4 illustrates an example of method 100 for operating an interconnect.

According to an embodiment, method 100 includes step 110 of performing at least one of (i) conveying second signals, by first signal conductors that are formed in a first metal layer of the interconnect portion, (ii) conveying second signals, by second signal conductors that are formed in a second metal layer of the interconnect portion, or (iii) conveying third signals, by third signal conductors that are formed in a third metal layer of the interconnect portion.

According to an embodiment, the first signals, the second signals and the third signals are high-frequency signals having a frequency that is at least one Gigahertz.

According to an embodiment, step 110 includes conveying, at a given point of time, two or more signals of the first signals and/or the second signals and/or the third signals.

According to an embodiment, method 100 also includes step 120 of performing at least one of (i) reducing cross talk related to the second signals, by metal cages of the interconnect portion, the metal cages surround the second signal conductors; wherein each metal cage includes a proximal conductive grid that is formed in the first metal layer, a distal conductive grid that is formed in the third metal layer; and a set of inter-layer vias that connect the proximal conductive grid to the distal conductive grid; and (ii) reducing cross talk between the first signals and the third signals by conductive cage coupling elements of the interconnect portion, the conductive cage coupling elements electrically couple the metal cages.

It should be noted that the metal cages may contribute to the crosstalk reduction between first signals and/or between third signals—as they are positioned between first signal conductors and third signal conductors. For example—a metal cage is configured to reduce cross talk between first signals conveyed over first signal conductors located at opposite sides of the metal cage.

According to an embodiment, step 120 includes grounding the metal cages by additional cross talk reduction elements.

According to an embodiment, step 120 is executed in parallel to step 110.

The suggested interconnect was compared to a reference interconnect that includes a second metal layer dedicated solely for grounding, as well as a first metal layer in which signals conductors were spaced apart by vertical conductors confined to the first metal layer, and a third metal layer in which signals conductors were spaced apart by vertical conductors confined to the third metal layer.

It has been found that:

a. At Bit Error Rare of $10^{-16}$ the eye width obtained when using the reference interconnect was 69.64 picosecond and the height was 212 millivolts, while the eye width obtained using the suggested interconnect was 107.7 picoseconds and the height was 299 millivolts.

b. The power sum of cross talk (PSXT) obtained when using the suggested interconnect was smaller than-38 dB at 4.2 Ghz—which provides an improvement of about 18 dB in comparison to the PSXT (−20 dB at 4.2 Ghz) when using the reference interconnect.

c. The ICR obtained when using the suggested interconnect exceeded 30 dB at 4.2 Ghz—which provides an improvement of about 14 dB in comparison to the ICR (exceeds 16 dB at 4.2 Ghz) when using the reference interconnect.

The results of the mentioned above measurements are illustrated in FIGS. 5-7.

Figure 5:
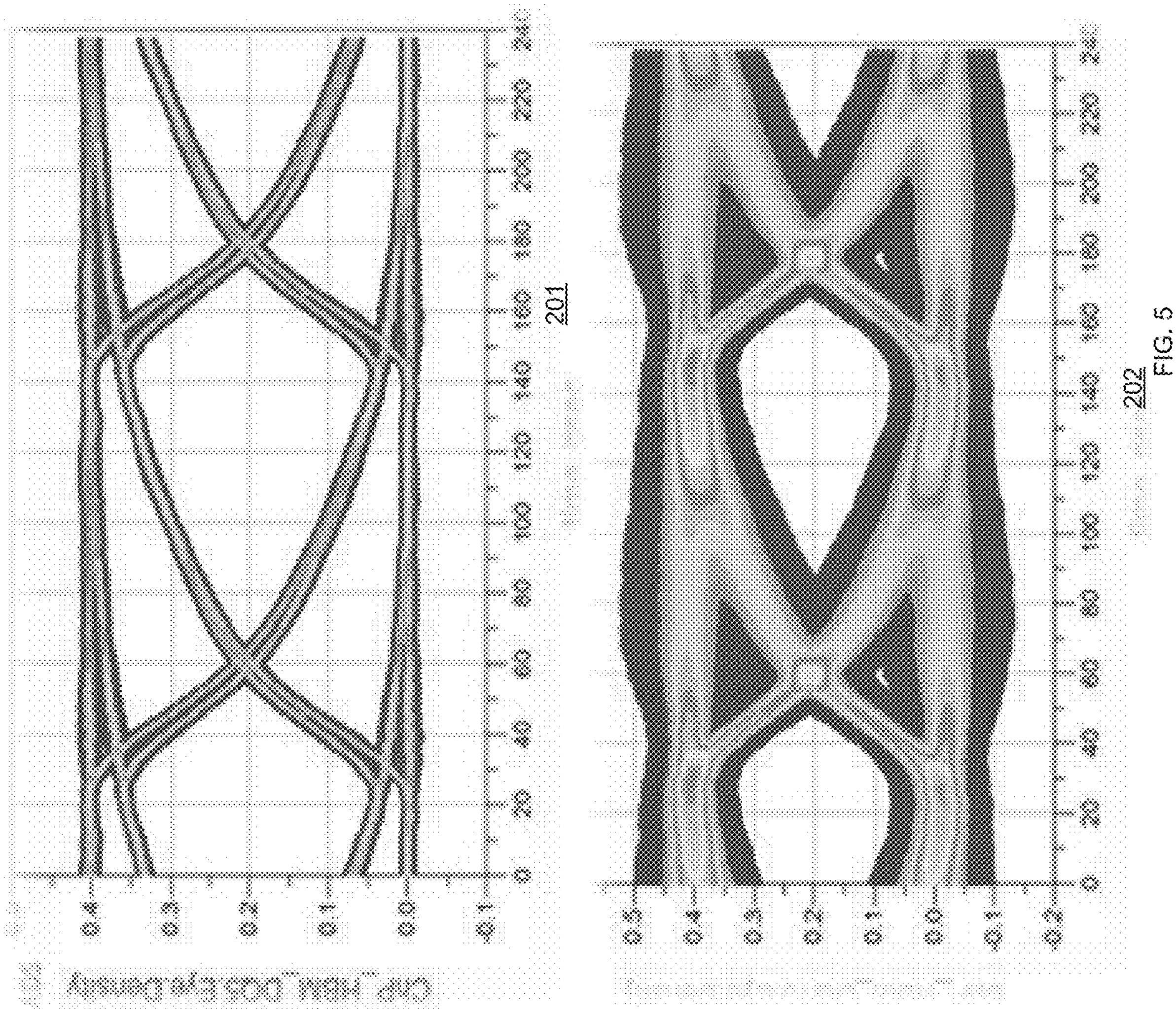
FIGS. 5-7 illustrate examples of measurements related to the interconnect and to a reference interconnect.
Figure 6:
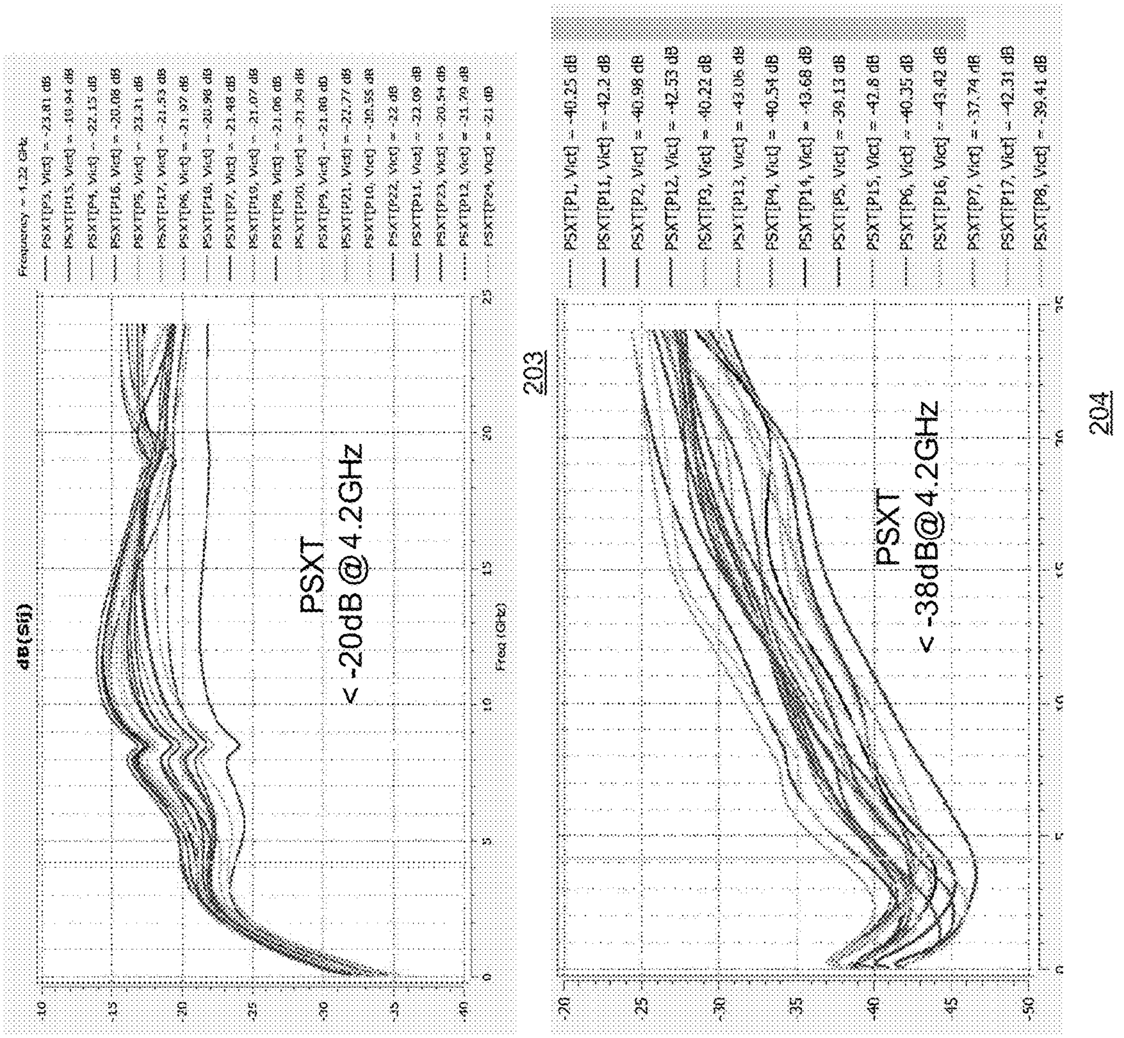
Figure 7:
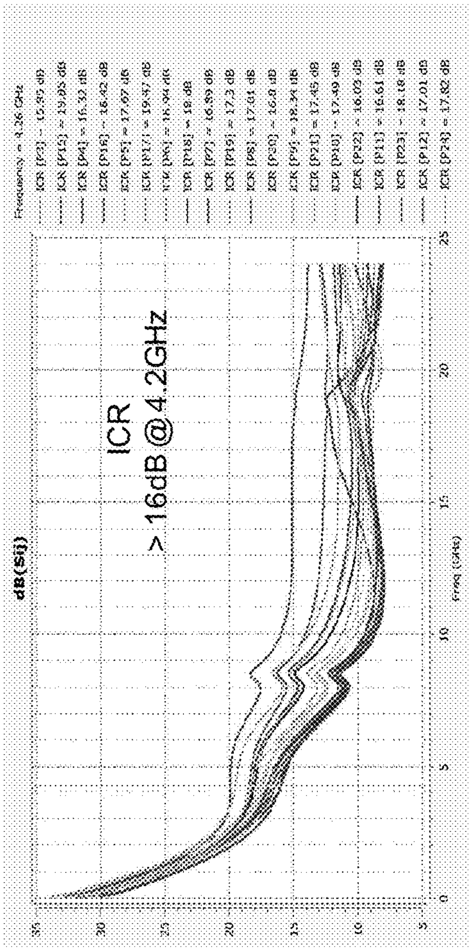
Figure 7:
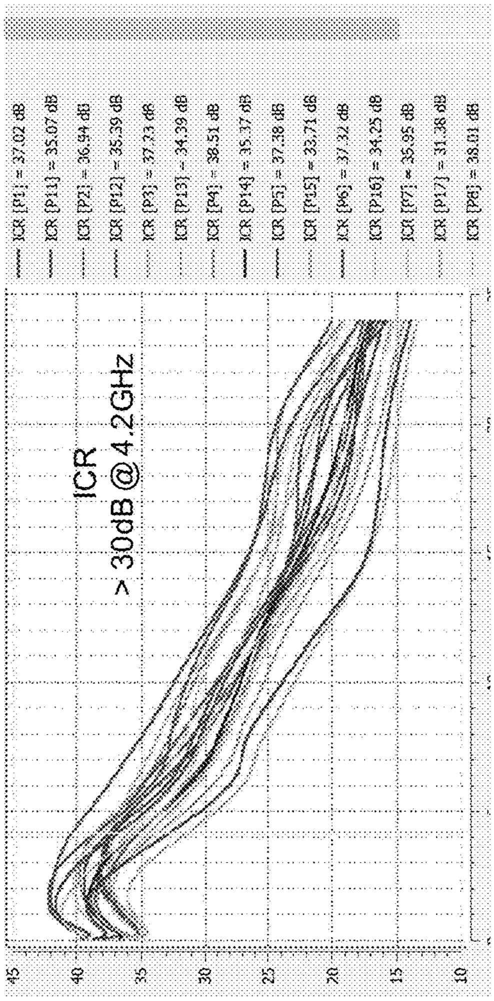

Eye diagram 201 of FIG. 5, PSXT graph 204 of FIG. 6 and ICR graph 206 of FIG. 7 relate to the suggested interconnect.

Eye diagram 202 of FIG. 5, PSXT graph 203 of FIG. 6 and ICR graph 205 of FIG. 7 relate to the reference interconnect.

In the foregoing detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarding the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device or system capable of executing the method.

Any reference in the specification to a system or device should be applied mutatis mutandis to a method that may be executed by the system, Any combination of any module or unit listed in any of the figures, any part of the specification and/or any claims may be provided.

Any combinations of systems, units, components, processors, sensors, illustrated in the specification and/or drawings may be provided.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above-described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above-described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within the same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by people skilled in the art that the embodiments of the disclosure are not limited by what has been particularly shown and described hereinabove. Rather the scope of the embodiments of the disclosure is defined by the appended claims and equivalents thereof.

We claim:

1. An interconnect, comprising:

an interconnect portion that comprises:

first signal conductors that are formed in a first metal layer and are configured to convey first signals;

second signal conductors that are formed in a second metal layer and are configured to convey second signals;

third signal conductors that are formed in a third metal layer and are configured to convey third signals; wherein the first signals, the second signals and the third signals are high-frequency signals having a frequency that is at least one Gigahertz;

metal cages that surround the second signal conductors and are configured to reduce cross talk related to the second signals; wherein each metal cage comprises (i) a proximal conductive grid that is formed in the first metal layer, (ii) a distal conductive grid that is formed in the third metal layer;

and (iii) a set of inter-layer vias that connect the proximal conductive grid to the distal conductive grid; and conductive cage coupling elements that electrically couple the metal cages and are configured to reduce cross talk between the first signals and the third signals.

2. The interconnect according to claim 1, further comprising additional cross talk reduction elements for grounding the metal cages.

3. The interconnect according to claim 2, wherein at least one additional cross talk reduction element is electrically coupled to a micro-bump.

4. The interconnect according to claim 1, wherein each metal cage is configured to shield a second signal conductor.

5. The interconnect according to claim 1, wherein the conductive cage coupling elements comprise metal grids.

6. The interconnect according to claim 5, wherein the conductive cage coupling elements are formed in the second metal layer.

7. The interconnect according to claim 1, comprising interconnect regions, each interconnect region comprises a corresponding conductive cage coupling element, a corresponding first signal conductor, a corresponding second signal conductor, a corresponding first metal cage and a corresponding second metal cage.

8. The interconnect according to claim 7, wherein the corresponding first signal conductor is (i) closer, in relation to the corresponding second signal conductor, to the corresponding first metal cage, and (ii) more distance, in relation to the corresponding second signal conductor, to the corresponding second metal cage.

9. The interconnect according to claim 1, wherein the interconnect portion further comprises additional metal layers located below the first metal layer.

10. The interconnect according to claim 1, wherein within the interconnect portion, the first metal layer, the second metal layer, and the third metal layer are parallel to each other.

11. The interconnect according to claim 1, wherein a distance between adjacent metal cages is below ten microns, and a distance between a metal cage and adjacent signal conductors is below ten microns.

12. A method for operating an interconnect having an interconnect portion, the method comprises:

conveying second signals, by first signal conductors that are formed in a first metal layer of the interconnect portion;

conveying second signals, by second signal conductors that are formed in a second metal layer of the interconnect portion;

conveying third signals, by third signal conductors that are formed in a third metal layer of the interconnect portion; wherein the first signals, the second signals and the third signals are high-frequency signals having a frequency that is at least one Gigahertz;

reducing cross talk related to the second signals, by metal cages of the interconnect portion, the metal cages surround the second signal conductors; wherein each metal cage comprises (i) a proximal conductive grid that is formed in the first metal layer, (ii) a distal conductive grid that is formed in the third metal layer; and (iii) a set of inter-layer vias that connect the proximal conductive grid to the distal conductive grid; and reducing cross talk between the first signals and the third signals by conductive cage coupling elements of the interconnect portion, the conductive cage coupling elements electrically couple the metal cages.

13. The method according to claim 12, further comprising grounding the metal cages by additional cross talk reduction elements.

14. The method according to claim 13, wherein at least one additional cross talk reduction element is electrically coupled to a micro-bump.

15. The method according to claim 12, wherein the conductive cage coupling elements comprise metal grids.

16. The method according to claim 15, wherein the conductive cage coupling elements are formed in the second metal layer.

17. The method according to claim 12, comprising interconnect regions, each interconnect region comprises a corresponding conductive cage coupling element, a corresponding first signal conductor, a corresponding second signal conductor, a corresponding first metal cage and a corresponding second metal cage.

18. The method according to claim 17, wherein the corresponding first signal conductor is (i) closer, in relation to the corresponding second signal conductor, to the corresponding first metal cage, and (ii) more distance, in relation to the corresponding second signal conductor, to the corresponding second metal cage.

19. The method according to claim 12, wherein a distance between adjacent metal cages is below ten microns, and a distance between a metal cage and adjacent signal conductors is below ten microns.

* * * * *